United States Patent [19]
Makita et al.

[11] Patent Number: 5,404,368
[45] Date of Patent: Apr. 4, 1995

[54] SEMICONDUCTOR OPTICAL APPARATUS HAVING AN IMPROVED PRECISION FOR THE OPTICAL BEAM POSITION

[75] Inventors: Akihiko Makita; Junichi Ichihara, both of Kawasaki, Japan

[73] Assignee: Fujitsu Limited, Kanagawa, Japan

[21] Appl. No.: 134,794

[22] Filed: Oct. 12, 1993

[51] Int. Cl.6 .............................................. H01S 3/04
[52] U.S. Cl. ......................................... 372/36; 372/43; 257/99
[58] Field of Search .................... 372/36, 43; 257/684, 257/707, 99

[56] References Cited

U.S. PATENT DOCUMENTS

| | | | |
|---|---|---|---|
| 4,768,070 | 8/1988 | Takizawa et al. | 372/36 |
| 5,136,152 | 8/1992 | Lee | 250/211 |
| 5,270,870 | 12/1993 | O'Brien et al. | 372/36 |
| 5,285,462 | 2/1994 | Kasahara | 372/36 |
| 5,309,460 | 5/1994 | Fujimaki et al. | 372/36 |
| 5,327,443 | 7/1994 | Tanaka et al. | 372/36 |

FOREIGN PATENT DOCUMENTS

| | | |
|---|---|---|
| 0259816 | 3/1988 | European Pat. Off. . |
| 60-113978 | 6/1985 | Japan . |
| 60-140775 | 7/1985 | Japan . |
| 60-219788 | 11/1985 | Japan . |
| 2-116186 | 4/1990 | Japan . |
| 2017958 | 10/1979 | United Kingdom . |

*Primary Examiner*—Georgia Y. Epps
*Attorney, Agent, or Firm*—Armstrong, Westerman, Hattori, McLeland & Naughton

[57] ABSTRACT

An optical semiconductor apparatus includes a laser diode for producing an optical beam, a base body formed with a first reference surface adapted for engagement with an external apparatus and a second reference surface separated from the first reference surface with a predetermined distance, and a subcarrier member having a principal surface for carrying the laser diode thereon said principal surface, wherein the subcarrier is mounted upon the base body in an abutted state such that the principal surface establishes an intimate engagement with the second reference surface. The base body is formed with a depression on the second reference surface so as to accommodate therein the laser diode when the subcarrier member is mounted upon the base body together with the laser diode that is mounted upon the principal surface.

10 Claims, 12 Drawing Sheets

5,404,368

SEMICONDUCTOR OPTICAL APPARATUS HAVING AN IMPROVED PRECISION FOR THE OPTICAL BEAM POSITION

BACKGROUND OF THE INVENTION

The present invention generally relates to semiconductor optical apparatuses, and more particularly to a semiconductor optical apparatus that includes therein a laser diode and which is adapted for mounting upon a host apparatus with improved precision with respect to the position of the optical beam produced by the laser diode.

Various electronic apparatuses use a laser diode. For example, laser diodes are used in optical disk devices, laser printers and optical telecommunication apparatuses.

When using a laser diode, an example shown in FIG. 1 by a numeral 2, in such electronic apparatuses, it is necessary to determine the position of the luminous spot designated in FIG. 1 by a numeral 5 with a high precision, particularly with respect to the expected beam position designated by a numeral P. Preferably, the offset A in FIG. 1 indicative of the deviation of the optical axis is set below a few microns. Similarly, the offset B in the axial direction should be set below a few microns.

Thus, it is necessary to fabricate the laser diode with a high precision in terms of the outer dimensions.

Further, the laser diode is required to have a compact size.

FIGS. 2 and 3 show an example of a conventional laser diode assembly 1.

Referring to the drawings, the laser diode assembly 1 includes a laser diode 2 mounted within a metal case 3.

The case 3 is formed by machining and includes a disc part 3a and a projecting part 3b projecting from the disc part 3a.

As shown in FIG. 2, the disc part 3a is formed generally symmetrical with respect to a center line $3a_1$ and has a surface $3a_2$ that acts as a reference surface when mounting the laser diode assembly 1 upon other apparatuses.

It will be noted that the projecting part 3b carries thereon a heat sink 4, and the laser diode 2 is mounted upon the heat sink 4. In FIG. 2, the edge of the laser diode 2 from which the optical beam is emitted is designated by a numeral 5. Hereinafter, the edge 5 will be referred to as a luminous point.

Further, the apparatus of FIG. 2 includes lead wires 6 and 7 as well as electrode pins 8 for external connection, and the laser diode 2 is protected by a cap 9 that is formed with a window 10 for passing the optical beam. Further, there is provided an optical detector 11.

Referring to FIG. 3, it will be noted that the heat sink 4 is mounted upon the projecting part $3b_1$ by a braze alloy layer 12, and the laser diode 2 itself is also mounted upon the heat sink 4 by another braze alloy layer 13.

In the laser diode assembly 1 having such a construction, it is preferred to determine the dimensions C, D and E as accurate as possible, preferably within the order of microns, wherein the dimension C and E represent the distance of the luminous spot 5 as measured from the center line $3a_1$ in the Y- and X-directions, while the dimension D represents the distance of the luminous spot 5 measured from the reference surface $3a_2$ in the Z-direction.

In the structure of FIG. 3, it will be noted that, because of the existence of the heat sink 4 and associated braze layers 12 and 13, there is a tendency that the distance C variates in the order of 100 μm even when the position of the projecting part 3b is determined with a high precision.

Similarly, there is a tendency that the dimensions D and E vary in the Z- and X-directions respectively in the order of 100 μm, due to the deviation associated with the mounting of the laser diode 2 upon the heat sink 4.

In order to overcome the foregoing problem, the laser diode assembly 1 is generally mounted upon an external host apparatus such as an optical disk apparatus 15 together with an adjusting mechanism as shown in FIG. 4.

Referring to FIG. 4, the laser diode assembly 1 is mounted upon a slidable plate 16 that acts as the adjusting mechanism, wherein the slidable plate 16 is mounted upon the external apparatus 15 by means of a screw 17. When mounting the laser diode assembly 1 upon the apparatus 15, the position of the apparatus 1 is adjusted in the X- and Y-directions to minimize the deviation for the dimensions C and E.

Further, the deviation with respect to the dimension D is compensated for by moving a collimator lens 18 in the Z-direction by actuating an eccentric cam 19.

Such a conventional laser diode assembly has an obvious drawback in that the apparatus requires a complicated adjusting process as well as mechanism when mounting upon the external apparatus 15. When the apparatus 15 is an optical pickup device, for example, such an adjusting process increases the number of steps that are needed to assemble the optical pickup device. Further, such a complex adjusting mechanism increases the size of the optical pickup device.

Further, it should be noted that the disk part 3a forming the case 3 of the apparatus 1 generally has a large diameter d which is as large as about 10 mm. Thereby, the apparatus 1 inevitably has a large size.

SUMMARY OF THE INVENTION

Accordingly, it is a general object of the present invention to provide a novel and useful optical semiconductor apparatus wherein the foregoing problems are eliminated.

Another and more specific object of the present invention is to provide an optical semiconductor apparatus including a laser diode wherein the positional precision of the laser diode is substantially improved.

Another object of the present invention is to provide an optical semiconductor apparatus adapted for mounting upon an external apparatus, said optical semiconductor apparatus comprising:
  a laser diode for producing an optical beam;
  a base body formed with a first reference surface adapted for engagement with said external apparatus when said optical semiconductor apparatus is mounted upon said external apparatus, and a second reference surface separated from said first reference surface with a predetermined distance; and
  a subcarrier member having a principal surface for carrying said laser diode on said principal surface, said subcarrier being mounted upon said base body in an abutted state such that said principal surface establishes an intimate engagement with said second reference surface;

said base body being formed with a depression on said second reference surface so as to accommodate therein said laser diode when said subcarrier member is mounted upon said base body together with said laser diode that is mounted upon said principal surface.

According to the present invention, the position of the principal surface of the subcarrier member is determined exactly with respect to the first reference surface of the base body, due to the abutted engagement with the second reference surface of the base body. Thereby, the position of the laser diode held upon the principal surface of the subcarrier member is determined exactly with reference to the first reference surface and hence the external apparatus. It should be noted that the subcarrier member acts also as a heat sink for dissipating heat from the laser diode to the base body.

In a preferred embodiment of the present invention, the base body has a rectangular shape having upper and lower principal surfaces, a second depression being formed on said lower principal surface, said second depression being defined by a bottom surface acting as said second reference surface, said second depression having a size sufficient for accommodating said subcarrier member therein, wherein one of said upper and lower major surfaces of said base body acting as said first reference surface. According to the present preferred embodiment, the subcarrier member is entirely accommodated in the second depression, and the external size of the base body is substantially reduced.

In another preferred embodiment of the present invention, said base body includes a passage of said optical beam that is produced by said laser diode, said passage being closed by an optical element. According to the present preferred embodiment, the optical element closing said passage eliminates penetration of dust into the interior of said depression in which said laser diode is accommodated.

In another preferred embodiment of the present invention, said semiconductor optical apparatus further comprises an elastic electrode protruding into said depression in which said laser diode is accommodated, such that said elastic electrode engages with said principal surface of said subcarrier member resiliently. According to the present preferred embodiment, it is possible to establish a reliable electrical contact between the electrode and the laser diode via the principal surface of the subcarrier member. Further, it is possible to adjust the position of the laser diode in the direction perpendicular to the principal surface of the subcarrier member as a result of the resilient force exerted by the elastic electrode.

In another preferred embodiment of the present invention, said subcarrier member includes a metal plate provided on a principal surface of said subcarrier member that opposes said principal surface on which said laser diode is provided, said metal plate being fixed upon said base body. According to the present preferred embodiment, an excellent heat dissipation is achieved for the laser diode via the metal plate.

In another preferred embodiment of the present invention, said metal plate is fixed upon said base body in a elastically deformed state when said subcarrier member is abutted to said first reference surface of said base body. According to the present preferred embodiment, a reliable engagement is obtained between the subcarrier member and the base body at the first reference surface.

Another object of the present invention is to provide an electronic apparatus, comprising:

a body formed with a reference surface;

a subcarrier member having a principal surface and mounted upon said body such that said principal surface of said subcarrier establishes an intimate contact with said reference surface of said body; and a laser diode carried on said principal surface and producing an optical beam;

said body being formed with a cavity at said reference surface for accommodating said laser diode.

According to the present invention, it is possible to reduce the number of parts of the apparatus while maintaining a high precision for the laser diode and the optical beam produced from the laser diode.

Another object of the present invention is to provide a method for manufacturing an optical semiconductor apparatus, said optical semiconductor apparatus comprising: a laser diode for producing an optical beam; a base body formed with a first reference surface adapted for engagement with said external apparatus when said optical semiconductor apparatus is mounted upon said external apparatus, and a second reference surface separated from said first reference surface with a predetermined distance; and a subcarrier member having a principal surface for carrying said laser diode on said principal surface, said subcarrier being mounted upon said base body in an abutted state such that said principal surface establishes an intimate engagement with said second reference surface; said base body being formed with a depression on said second reference surface so as to accommodate therein said laser diode when said subcarrier member is mounted upon said base body together with said laser diode that is mounted upon said principal surface; wherein said method comprises a step of:

moving said subcarrier member with respect to said base body in the state that said laser diode carried thereon is energized, while maintaining said intimate engagement between said subcarrier member and said base body. According to the present invention, it is possible to adjust the position of the laser diode within the optical semiconductor apparatus. Thereby, the need for the adjustment of the optical semiconductor apparatus after the optical semiconductor apparatus is mounted upon a host apparatus, can be eliminated. Associated with this, mechanisms for effecting such an adjustment can be eliminated from the optical semiconductor apparatus and the size of the optical semiconductor apparatus and hence the host apparatus is substantially reduced.

Other objects and further features of the present invention will become apparent from the following detailed description when read in conjunction with the attached drawings.

DETAILED DESCRIPTION OF THE PREFERRED EMBODIMENTS

Figure 6:
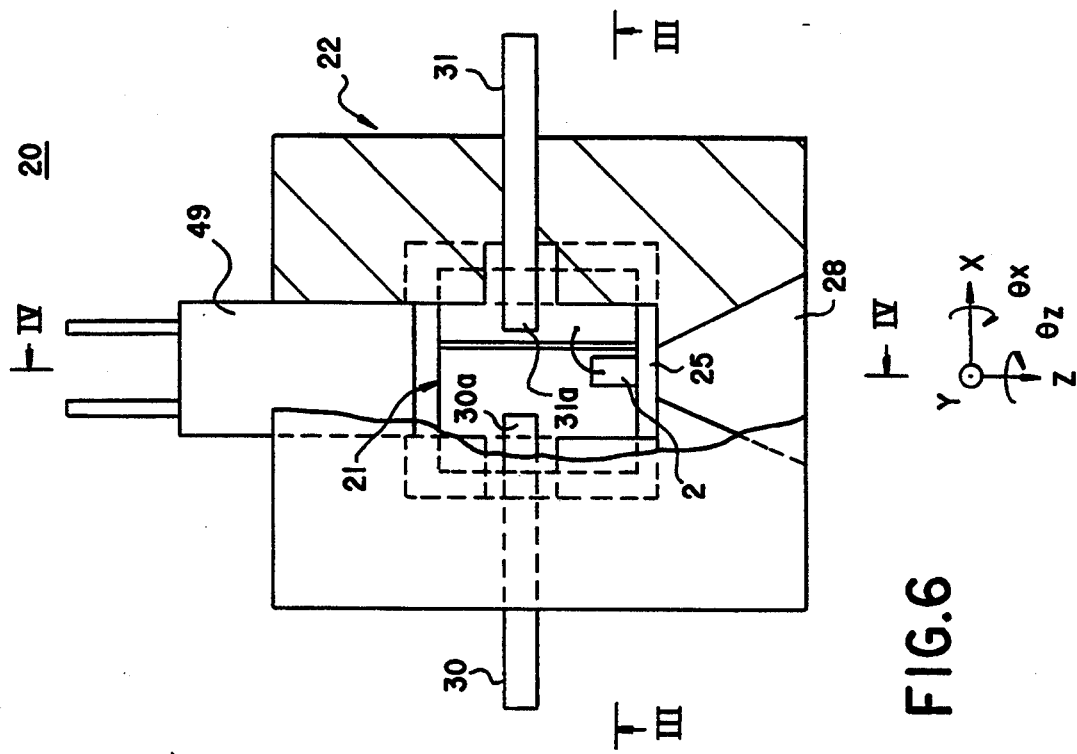
FIGS. 5–8 are diagrams showing a first embodiment of the laser diode assembly according to a first embodiment of the present invention.
Figure 5:
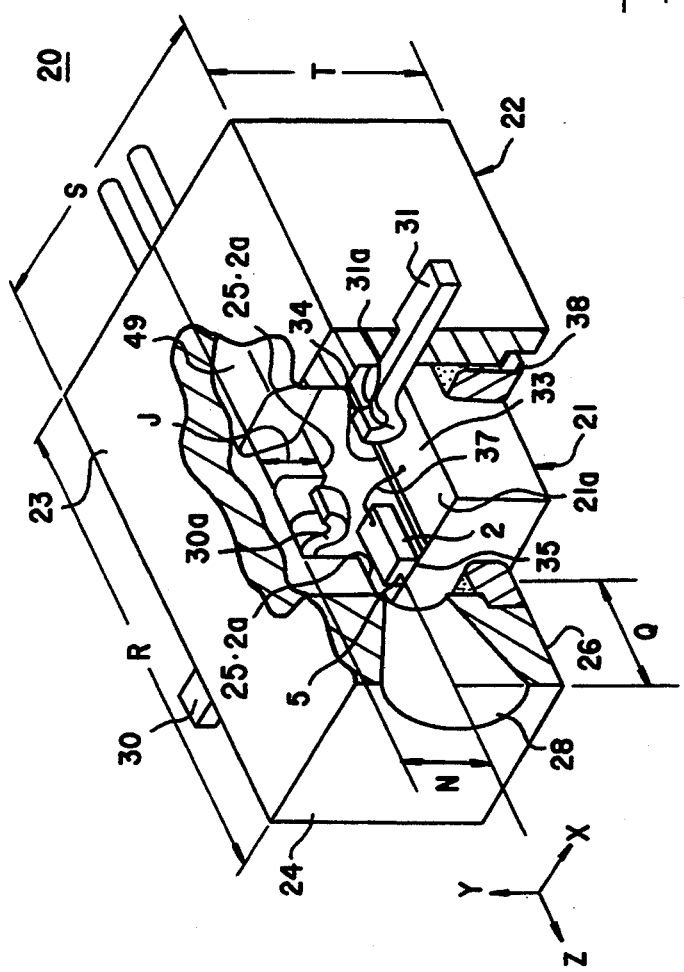
Figure 7:
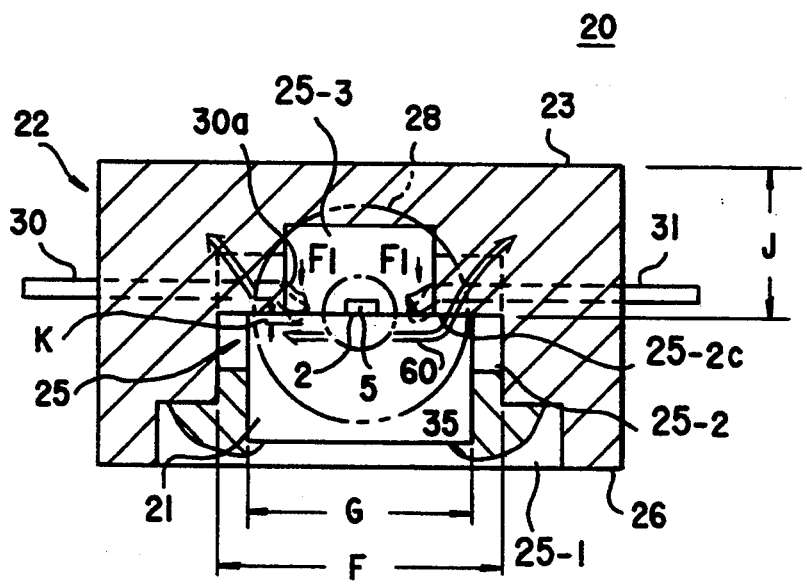
Figure 8:
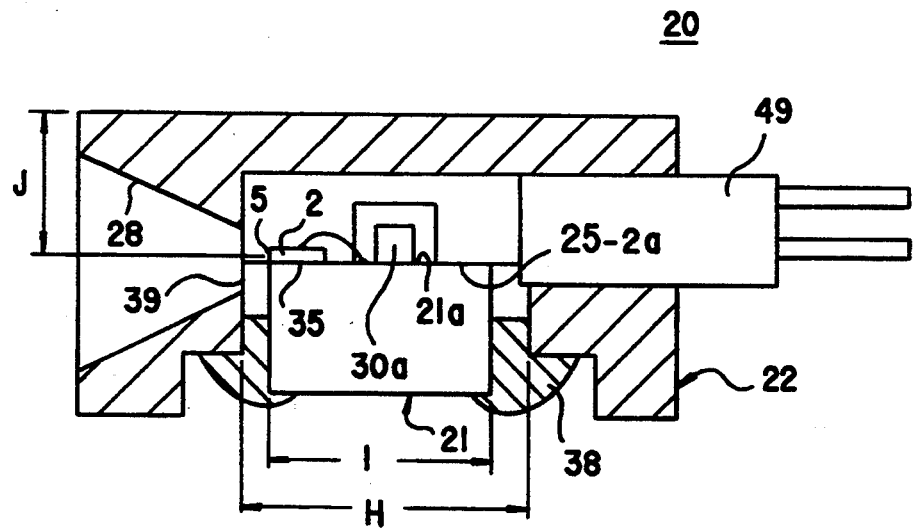

FIGS. 5–8 show a laser diode assembly 20 according to a first embodiment of the present invention, wherein FIG. 5 shows the diode assembly 20 in a perspective view a part of which is removed, FIG. 6 shows a plan view a part of which is removed, FIG. 7 shows a transversal cross sectional view, while FIG. 8 shows a longitudinal cross sectional view.

Referring to the drawings, the laser diode assembly generally includes a subcarrier member 21 that carries thereon a laser diode 2 and a case 22 of the apparatus that carries the subcarrier member 21.

The case 22 may be formed of aluminum having an anodized protective coating, a heat resistant plastic or a ceramic, and typically has a rectangular shape.

The case 22 has an upper major surface 23 acting as a first reference surface when mounting the laser diode assembly upon an external apparatus.

The case 22 has a front surface 24 that also acts as a second reference surface for mounting upon an external apparatus.

The case 22 has a depression 25 having a bottom surface 26, wherein the depth of the depression 25 increases stepwise toward the central part of the bottom surface 26.

The depression 25 includes a first depression part $25_{-1}$ that has a size for allowing insertion of a manipulation hand to be described later and a second depression part $25_{-2}$ formed generally at the central part of the first depression part $25_{-1}$ with an increased depth as compared with the depth of the depression part $25_{-1}$. The depression part $25_{-1}$ is applied with an adhesive as will be described later, while the depression part $25_{-2}$ has transversal and longitudinal sizes F and H substantially larger than corresponding transversal and longitudinal sizes G and I of the foregoing subcarrier member 21. Further, the case 22 is formed with a third depression $25_{-3}$ in correspondence to the central part of the depression $25_{-2}$ for accommodating the laser diode.

In such a structure, a bottom surface $25_{-2a}$ of the depression part $25_{-2}$ forms another, third reference surface separated from the first reference surface 23 by a distance J, wherein the position of the bottom surface and hence the distance J is determined within the precision of a few microns.

On the front reference surface 24, there is provided a tapered aperture 28 so as to penetrate through and reach the depression part $25_{-3}$ as a passage of the laser beam that has been produced by the laser diode 2.

Further, there are provided electric leads 30 and 31 having respective inner ends 30a and 31a encapsulated within the case 22 by a glass, while outer ends of the leads 30 and 31 protrude laterally from the case 22.

The foregoing inner ends 30a and 31a have resiliency and protrudes into the depression part $25_{-3}$, toward the reference surface $25_{-2a}$. When in the free state, the inner ends 30a and 31a crosses the reference surface $25_{-2a}$ by a distance K as indicated in FIG. 7 by a broken line.

The subcarrier member 21 is formed of an insulating material having simultaneously a high thermal conductivity. Preferably, the subcarrier member 21 is formed of a ceramic material such as aluminum nitride or boron nitride, or alternatively of silicon having an insulative coating. Typically, the subcarrier member 21 has a rectangular shape and acts as a base as well as a heat sink of the laser diode 2.

Figure 9:
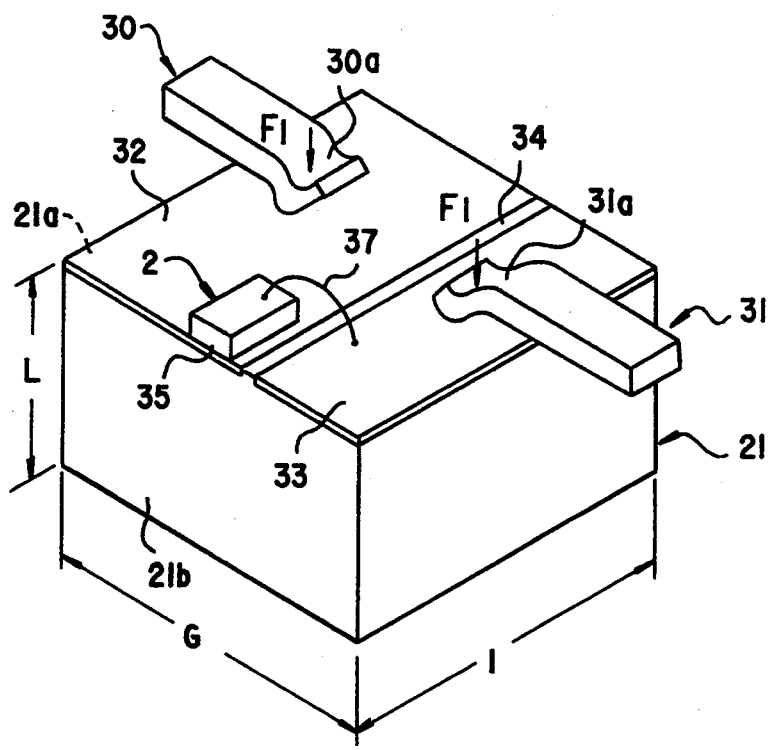
FIG. 9 is a diagram showing the electrical connection achieved in the laser diode assembly of the first embodiment.

As indicated in FIG. 9, the subcarrier member 21 has the lateral size G and the longitudinal size I as well as a height L, each in the order of several millimeters which is suitable for handling by a manipulation hand. As noted before, the subcarrier member 21 has a size slightly smaller than the depression part $25_{-2}$.

The subcarrier 21 has an upper major surface 21a on which electrode films 32 and 33 are provided, with an intervening insulation part 34 formed therebetween.

The laser diode 2 is provided on the upper major surface 21a of the subcarrier member 21 adjacent to a longitudinal edge 21b in a state that the laser diode 2 is brazed upon the electrode film 32 via a solder layer 35.

Further, a lead wire 37 establish an electrical connection between the upper surface of the laser diode 2 and the electrode film 33.

Figure 10:
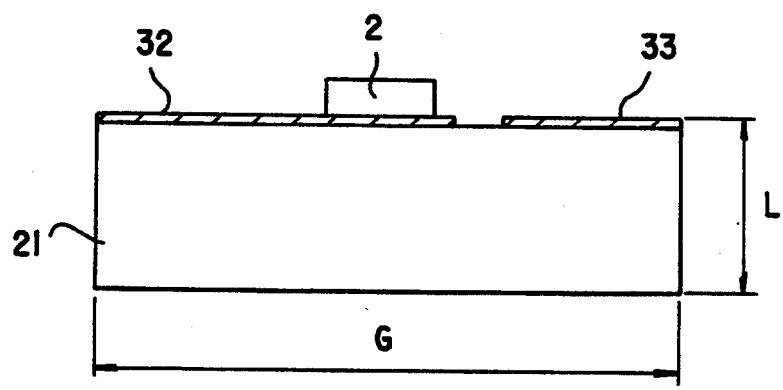
FIG. 10 is a diagram showing a subcarrier used in the laser diode assembly of the first embodiment.

FIG. 10 shows a vertical cross sectional view of the subcarrier 21. As shown in FIG. 10, the two electrodes of the laser diode 2, carried on the upper surface and the lower surface of the laser diode 2, are connected respectively to the electrode film 32 and the electrode film 33 with a reliable electrical insulation therebetween.

Figure 11:
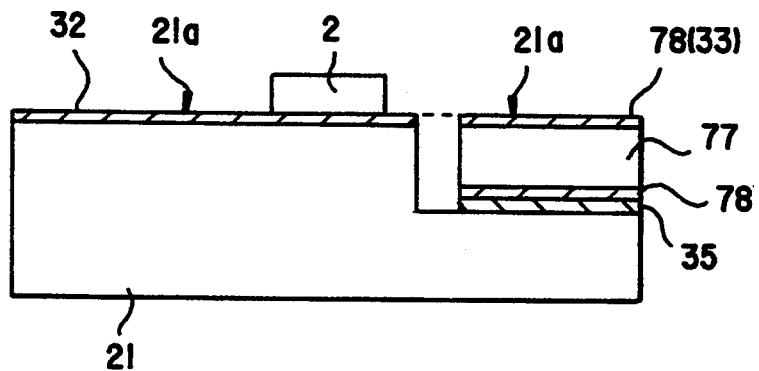
FIG. 11 is a diagram showing a modification of the laser diode assembly of the first embodiment.

FIG. 11 is a diagram corresponding to FIG. 10 and shows a cross sectional view of a carrier member 21A made of copper. In the embodiment of FIG. 11, a ceramic insulating base 77 is provided in correspondence to where the electrode film 33 is to be formed, for achieving the electric insulation between the electrode film 32 and the electrode film 33. It should be noted that insulating base 77 carries a metal layer 78 on the upper and lower major surfaces thereof.

The lower metal layer 78 is brazed upon the copper base 21 via a braze alloy layer 35.

On the other hand, the upper metal layer 78 acts as the electrode film 33.

In order to maintain the level of the upper major surface 21a substantially flush between the copper base 21 and the ceramic base 77, the subcarrier 21A is applied with a polishing process in correspondence to the upper major surface thereof, after the insulating base 77 is mounted upon the copper base 21.

It should be noted that the subcarrier member 21 is mounted upon the case 22 in the state that the surface 21a that carries the laser diode 2 thereon is abutted upon the reference surface 25-2a. Thereby, the periphery of the member 21 is fixed upon the case 22 permanently by an adhesive 38 while maintaining the foregoing abutting engagement.

Figure 1:
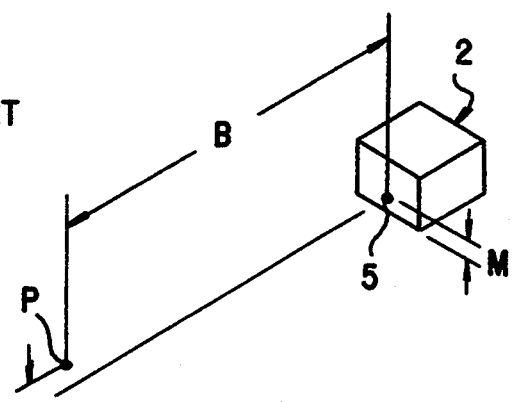
FIG. 1 is a diagram showing the relationship between a laser diode and an optical beam produced from the laser diode.
Figure 2:
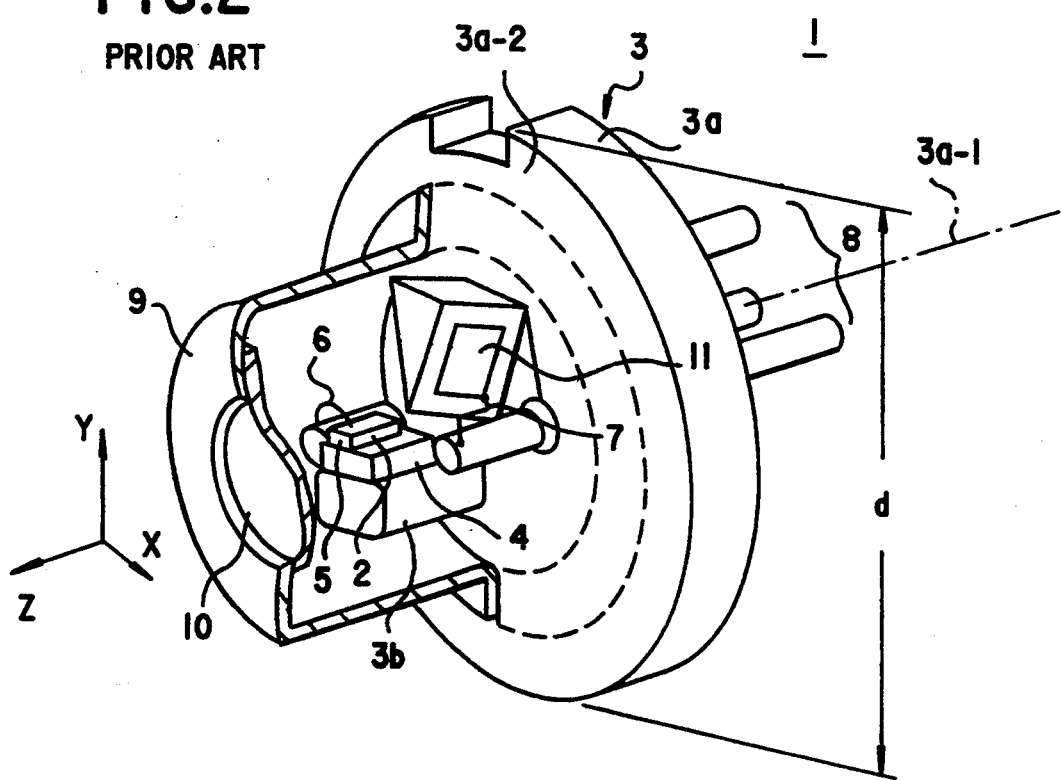
FIG. 2 is a diagram showing the construction of a conventional laser diode assembly.
Figure 4:
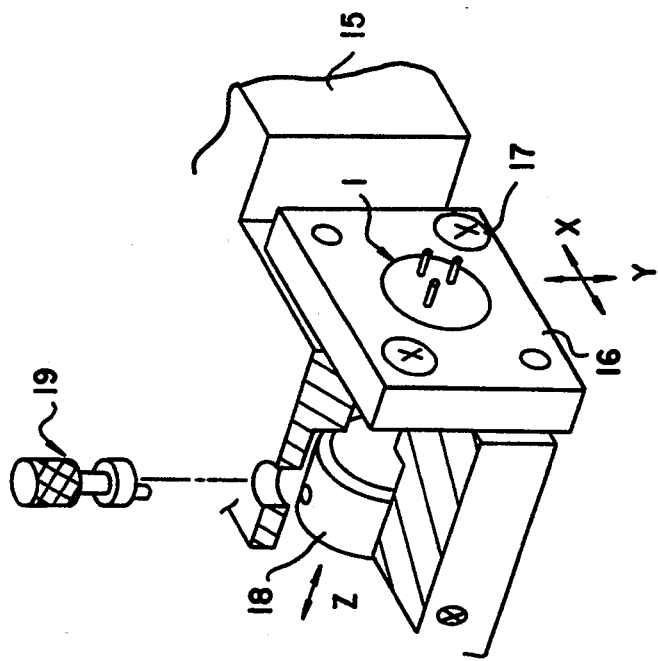
FIG. 4 is a diagram showing an adjusting mechanism used in the conventional laser diode assembly for adjusting the position of the optical beam produced therefrom.
Figure 3:
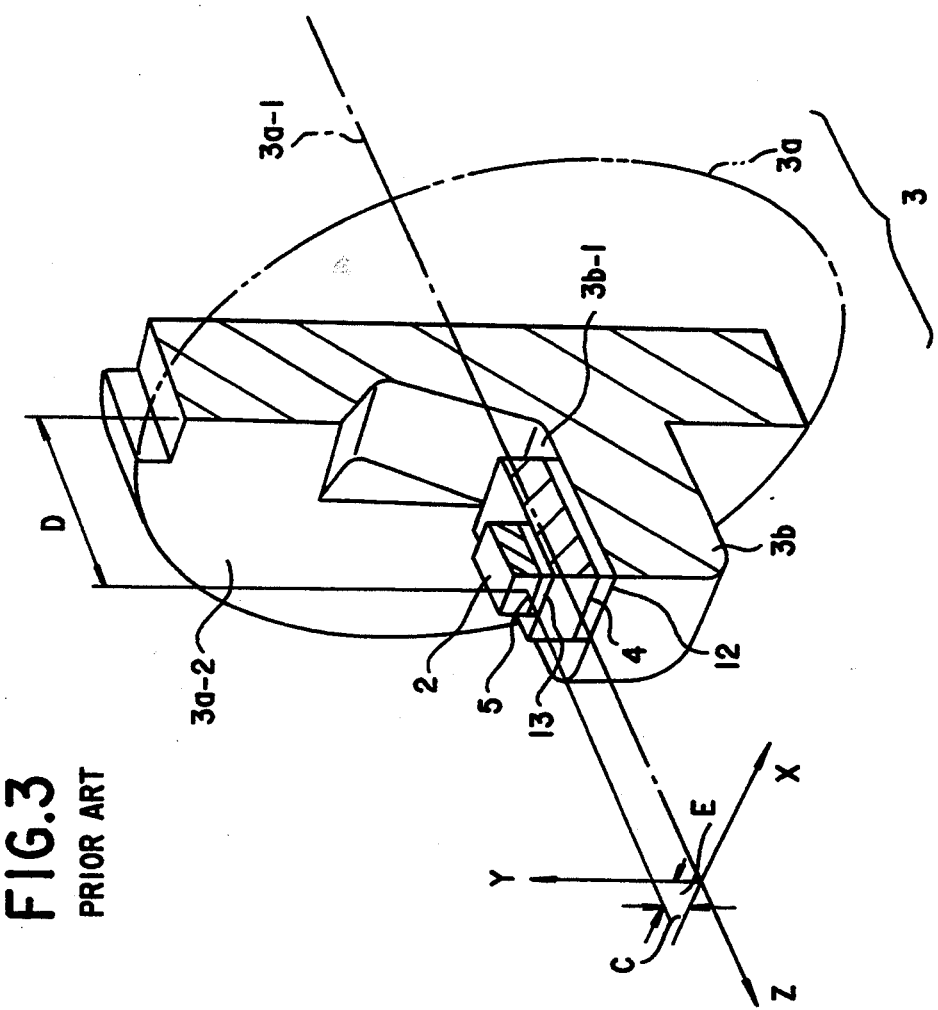
FIG. 3 is a diagram showing the laser diode assembly in a cross sectional view.

It should be noted that the laser diode 2 is formed by an epitaxial process. Therefore, the distance between a surface 2a of the laser diode 2 that is brazed upon the subcarrier member and the luminous point 5 shown in FIG. 1, is determined with a high precision. In FIG. 1, the foregoing distance is designated as M.

Thus, the distance N designated in FIG. 5 between the reference surface 23 and the luminous point 5 can be determined within the precision of a few microns by simply mounting the subcarrier member 21 on the case 22.

Further, as a result of the positional adjustment to be described later, one can determine the distance Q between the front reference surface 24 and the luminous point 5 within the precision of a few microns.

The inner ends 30a and 31a of the leads 30 and 31 are urged by the subcarrier 21 upon the mounting of the subcarrier 21 on the case 22, and the electrodes 30 and 31 are urged to the electrode films 32 and 33 as a result of the resilient force $F_1$ thus built up in the electrodes 30 and 31.

Referring to FIG. 5 again, there is provided a monitor photodetector 49 that is mounted upon the case 22.

The laser diode assembly 20 of the foregoing construction typically has an overall longitudinal length R and an overall transversal width S of about 4 mm, while an overall height T is set to about 2 mm. Thereby, the laser diode assembly 20 has a substantially reduced size as compared with conventional laser diode assemblies.

Next, adjustment that is conducted in the laser diode assembly of the present invention when assembling the apparatus, will be described.

Figure 12:
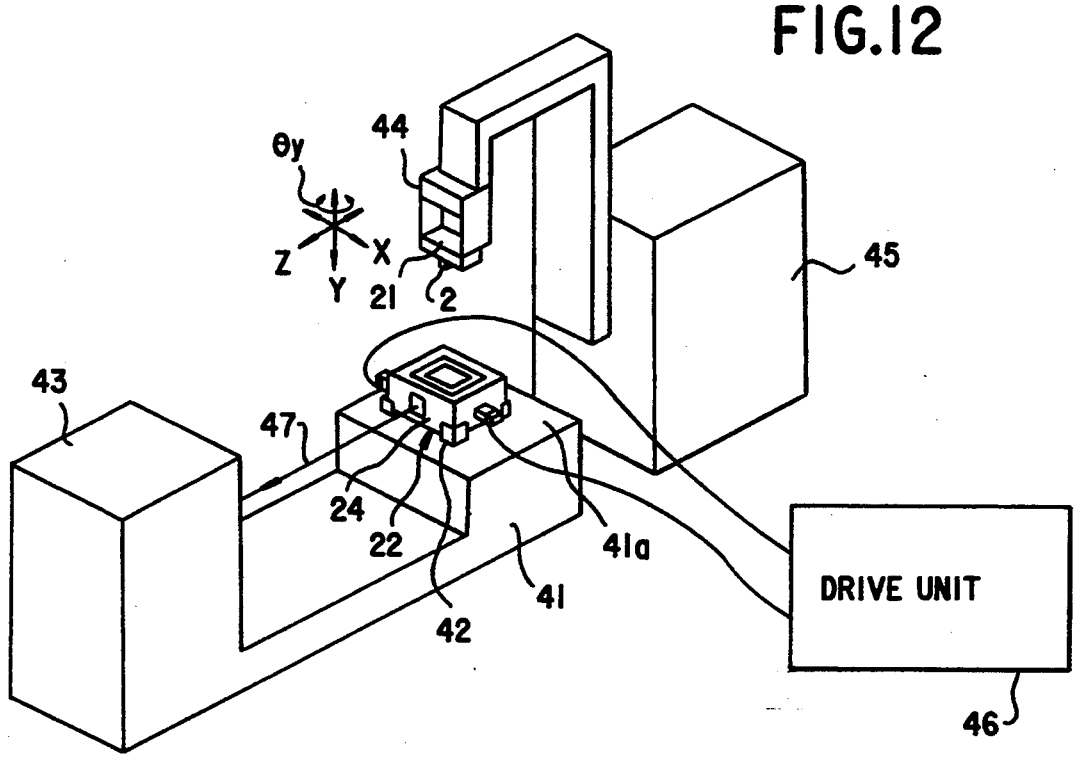
FIG. 12 is a diagram showing an assembling of the laser diode assembly of the first embodiment.

FIG. 12 shows a jig 40 used for such an assembling process.

Referring to FIG. 12, the jig 40 includes a base 41 and a positioning part 42 formed on the base 41.

The numeral 43 shows an optical detector.

The numeral 44 represents a manipulation hand used for clamping the foregoing subcarrier member 21.

The manipulation hand 44 is driven by a drive unit 45 that moves the hand 44 in the X-, Y- and Z-directions as indicated by arrows. Further, the hand 44 rotates about the Y-axis as indicated by $\theta_y$.

Figure 13:
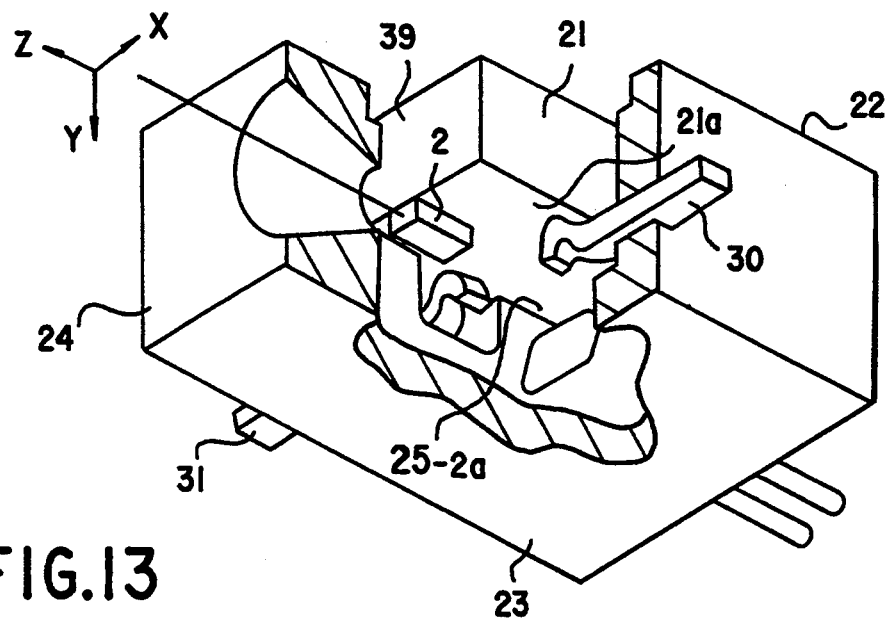
FIG. 13 is a diagram showing the laser diode assembly of the first embodiment in the state that the subcarrier is incorporated into a case of the assembly.

When assembling the apparatus 20, the empty case 22 is turned over upside down as indicated in FIG. 13, and the case 22 thus turned over is placed on the base 41 such that the reference surface 23 contacts with an upper major surface 41a of the base 41. Further, the position of the case 22 is determined by contacting the front reference surface 24 to the positioning part 42.

Further, a laser driving power unit 46 is connected to the lead electrodes 30 and 31.

Further, the hand 44 holds the subcarrier member 21 that in turn carries thereon the laser diode, and the hand 44 lowers the subcarrier member 21 in the Y-direction, such that the subcarrier member 21 is accommodated within the depression 25 formed in the case 22. Thereby, the upper major surface 21a of the subcarrier member 21 is abutted to the reference surface 25-2a.

In this state, the laser diode 2 is driven and a laser beam 47 is produced in response thereto. Thereby, the laser beam 47 enters the photodetector 43 via the aperture 28 mentioned previously.

Next, the manipulation hand 44 is driven in the Z-, X- and $\theta_y$-directions while monitoring the output of the photodetector 43, such that the subcarrier 21 is moved by a minute distance in the X-Z plane in search of the maximum of the output of the photodetector 43. Upon detection of the maximum, the driving of the hand is interrupted and the subcarrier member 21 is fixed upon the case 22 by applying the adhesive 38 such that the adhesive 38 fills the gap 39 between the periphery of the subcarrier member 21 and the depression part 25-2.

As a result of the foregoing assembling process, the subcarrier member 21 is fixed permanently upon the case 22 of the laser diode assembly 20 in the state that the position of the luminous point 5 of the laser diode 2 is determined with a high precision with respect to the reference surfaces 23 and 24.

It should be noted that the depression part 25-1 has a size large enough to accept the manipulation hand 44. Further, the depression part 25-2 is formed with a size for allowing the lateral movement of the subcarrier member 21. Thus, the positional adjustment of the subcarrier member 21 can be achieved without problem in the foregoing construction of the apparatus 20.

Further, one may avoid the process of turning over the case 21 upside down, when mounting upon the base 41, by using a vacuum suction mechanism.

In the foregoing assembling process, it should be noted that there is no necessity for the positional adjustment in the Y-direction, as the necessary precision of the laser diode 2 is obtained by simply abutting the subcarrier member 21 against the case 22 as described above.

Figure 16:
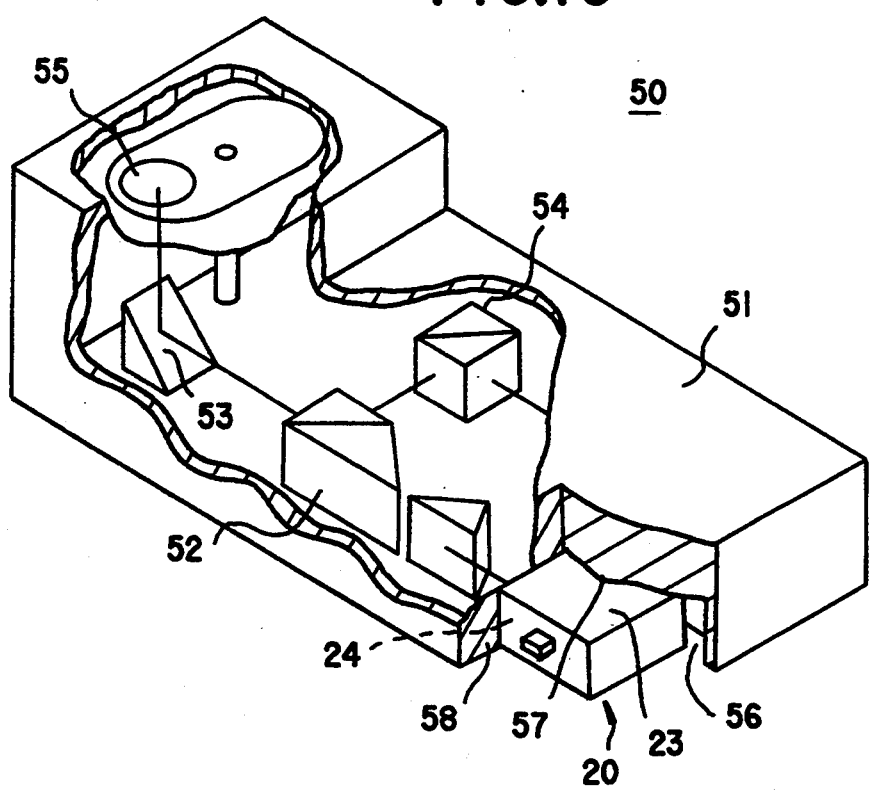
FIG. 16 is a diagram showing the mounting of the laser diode assembly of the first embodiment upon an optical pickup device.

The laser diode assembly 20 thus assembled is mounted upon an external apparatus 50 such as an optical pickup device of an optical disk drive as shown in FIG. 16.

The optical pickup device 50 includes various optical elements such as a prism 52, a mirror 53, a beam splitter 54 and an objective lens 55 in a housing 51.

The housing 51 is formed with a mounting part 56 for mounting the laser diode assembly 20 thereon, wherein the mounting part 56 includes reference surfaces 57 and 58 for abutting engagement with the laser diode assembly 20. It should be noted that the housing 51 has a substantially reduced size as compared with the housing of the conventional optical pickup devices, as the housing 51 lacks various adjusting mechanisms for positional adjustment of the laser diode assembly 20.

In the optical pickup device 50, the optical elements such as the prism 52, the mirror 53, the beam splitter 54, the objective lens 55, and the like, are disposed with a predetermined positional relationship determined with respect to the foregoing reference surfaces 57 and 58.

When assembling the optical pickup device 50, the laser diode assembly 20 is mounted such that the reference surface 23 of the apparatus 20 establishes an abutting engagement with the reference surface 57 and such that the front reference surface 24 establishes an abutting engagement with the reference surface 58.

Because of such a construction of the optical pickup device 50, the position of the luminous spot 5 of the laser diode 2 is determined exactly with reference to the reference surfaces 57 and 58, and one can eliminate the positional adjustment after the apparatus 20 is mounted upon the pickup device 50.

As a result, the efficiency for manufacturing the optical pickup device 50 increases substantially.

Further, the heat that is produced by the laser diode 2 during the operational state of the laser diode assembly 20 is dissipated to the subcarrier member 21 as indicated in FIG. 7 by an arrow 61, wherein the heat is dissipated further to the case 22 of the apparatus 20 through the abutting reference surfaces $21a$ and $25_{-2a}$.

Figure 14:
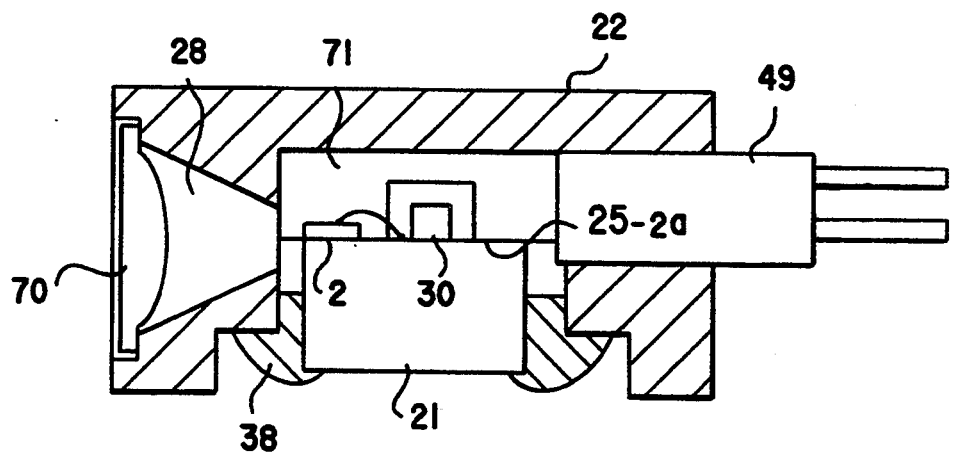
FIG. 14 is a diagram showing the laser diode assembly according to a second embodiment of the present invention.

FIG. 14 shows a laser diode assembly 20A according to a second embodiment of the present invention.

Referring to FIG. 14, the apparatus 20A includes, in addition to the apparatus 20 of FIG. 5, a collimator lens 70 that is provided in correspondence to the aperture 28. The lens 70 closes the aperture 28 and forms a closed space 71 in which the laser diode 2 is accommodated.

Figure 15:
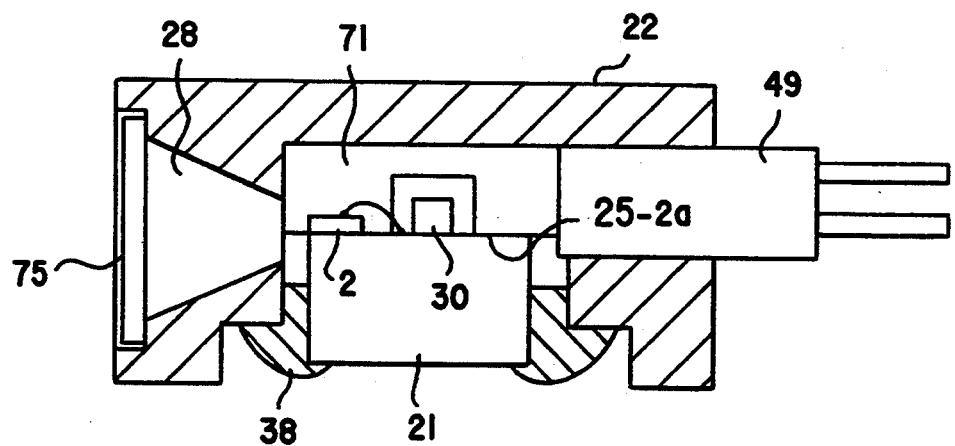
FIG. 15 is a diagram showing the laser diode assembly according to a third embodiment of the present invention.

FIG. 15 shows a laser diode assembly 20B according to a third embodiment of the present invention.

Referring to FIG. 15, the apparatus 20B uses a simple optical window 75 in place of the lens 70 of the apparatus 20A.

Figure 18:
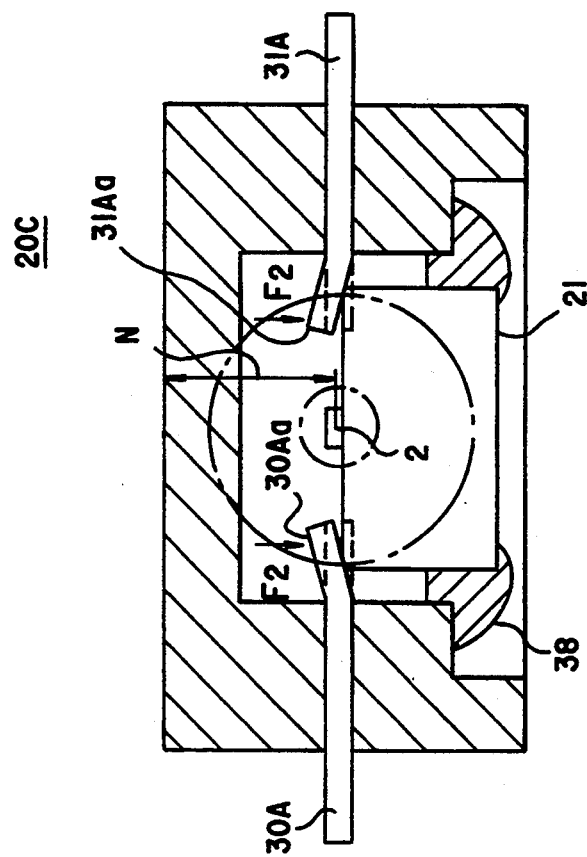
FIG. 18 is a diagram showing the laser diode assembly of FIG. 17 in a transversal cross sectional view.
Figure 17:
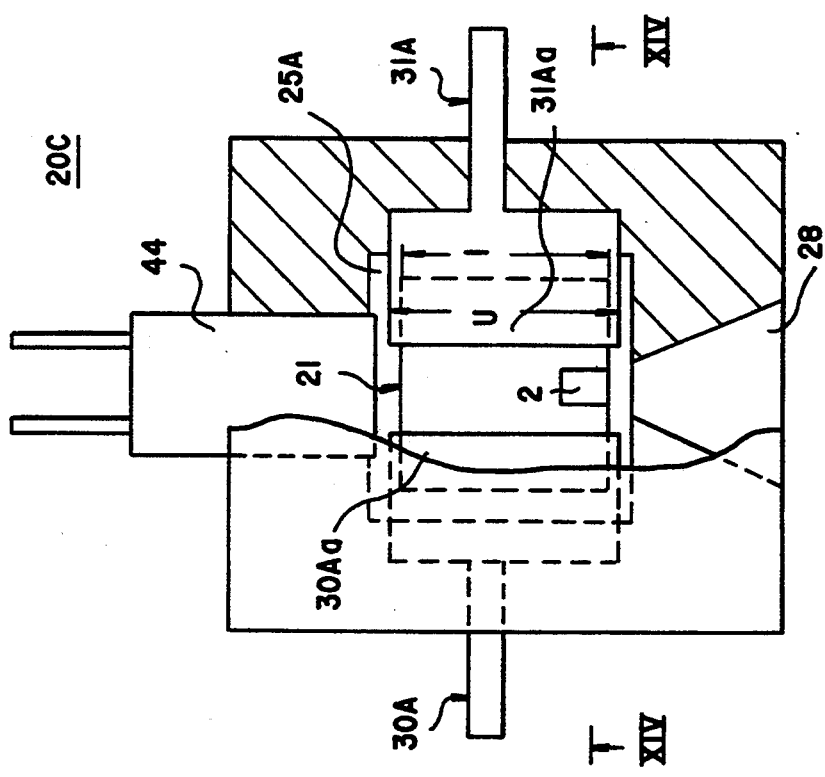
FIG. 17 is a diagram showing the construction of the laser diode assembly according to a fourth embodiment of the present invention.

FIGS. 17 and 18 show a laser diode assembly 20C according to a fourth embodiment of the present invention.

Referring to the drawings, the laser diode assembly 20C includes lead electrodes 30A and 31A having contact parts 30Aa and 31Aa at respective distal ends each having a width U corresponding to the size I of the subcarrier member 21.

In the free state wherein the subcarrier member 21 is not mounted, the contact parts 30Aa and 31Aa assume the state shown in FIG. 18 by a broken line.

In the present embodiment, the subcarrier member 21 is accommodated in a depression part 25A formed in the case 22 of the apparatus 20C, wherein the depression part 25A lacks the foregoing reference surface $25_{-2a}$.

In such a construction, the subcarrier member 21 is urged against the contact parts 30Aa and 31Aa as indicated in FIG. 17, and the contact parts 30Aa and 31Aa experience elastic deformation as a result. By adjusting the amount of the elastic deformation, one can adjust the position of the carrier member 21 in the Z- and X-directions as well as in the Y-direction. In other words, the construction of the present embodiment provides a possiblity of three-dimensional adjustment of the subcarrier member 21.

More specifically, the present invention enables a positional adjustment of the laser diode 2 with respect to the distance N shown in FIG. 18.

Further, it is possible to adjust the orientation of the laser diode not only about the Y-axis as represented by the rotational angle $\theta_y$ by also about the X- and Z-axis as represented by the rotational angles $\theta_x$ and $\theta_y$.

FIG. 18 shows the state wherein the subcarrier member 21 is fixed upon the case of the apparatus 20C by the adhesive in the state that the contact parts 30Aa and 31Aa are deformed elastically so as to exert a force $F_2$ upon the member 21.

Figure 19:
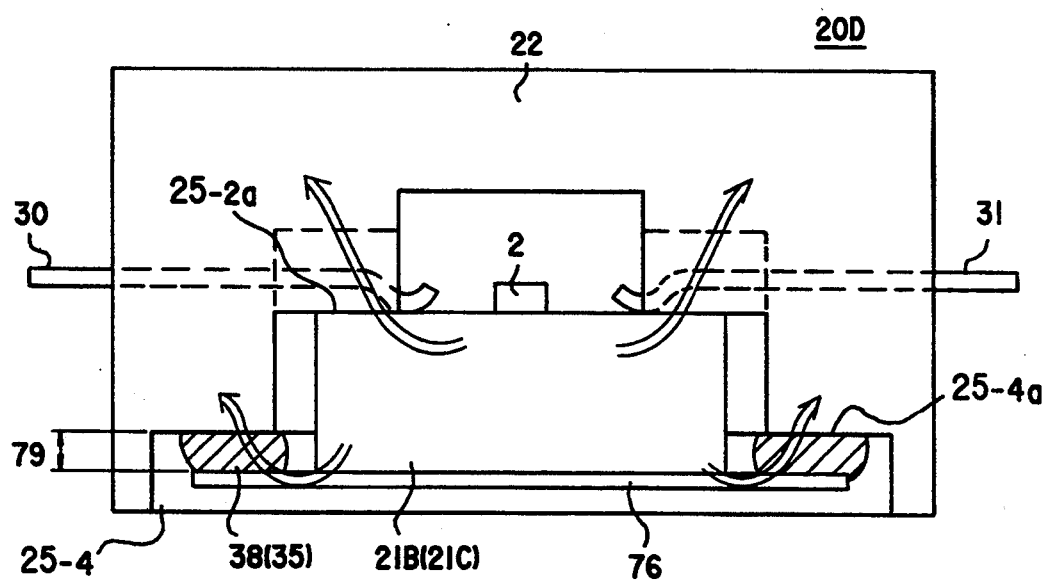
FIG. 19 is a diagram showing the construction of the laser diode assembly according to a fifth embodiment of the present invention.

FIG. 19 shows a laser diode assembly 20D according to a fifth embodiment of the present invention in a cross sectional view corresponding to FIG. 7.

Referring to FIG. 19, the apparatus 20D includes, in addition to the construction of the apparatus 20 of FIG. 5, a metal sheet 76 and a depression part $25_{-4}$ for accepting the metal sheet 76.

The metal sheet 76 may be formed of a metal such as copper or phosphor bronze, or a heat conductive plastic having a metal coating of gold, silver or copper thereon.

Figure 20A:
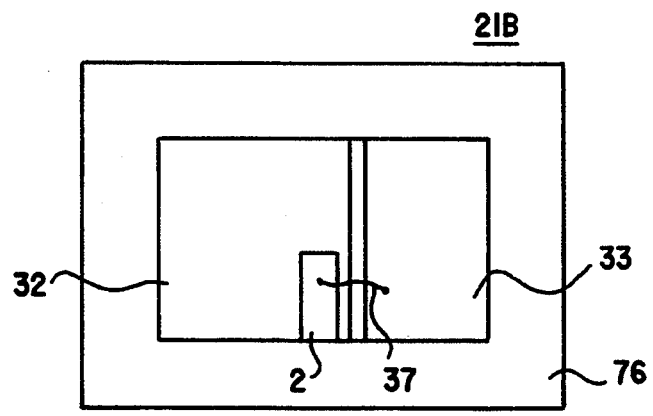
FIGS. 20(A) and 20(B) are diagrams showing an example of the construction of the subcarrier member used in the embodiment of FIG. 19.
Figure 20B:
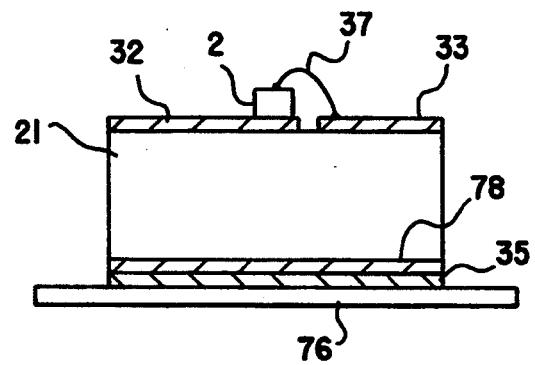

FIGS. 20(A) and 20(B) show a subcarrier member 21B corresponding to the subcarrier member 21 of FIG. 10, wherein FIG. 20(A) shows the plan view while FIG. 20(B) shows a side view. It will be noted that the subcarrier 21B includes a metal layer 78 in correspondence to the lower major surface thereof, and a metal sheet 76 is mounted upon the metal layer 78 via a braze alloy 35.

As will be shown in FIG. 20(A), the subcarrier 21B is held substantially at the central part of the metal sheet 76.

Figure 21A:
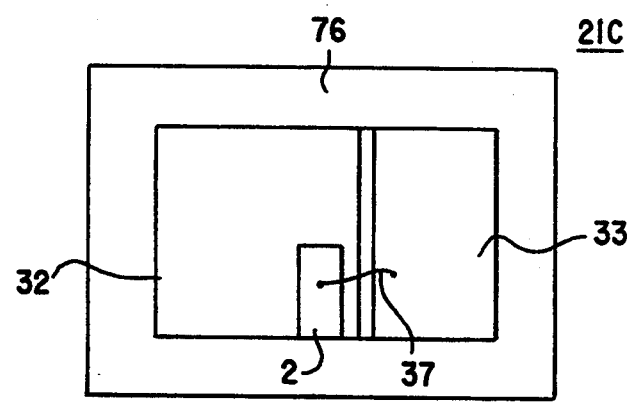
FIGS. 21(A) and 21(B) are diagrams showing another example of the construction of the subcarrier member used in the embodiment of FIG. 19.
Figure 21B:
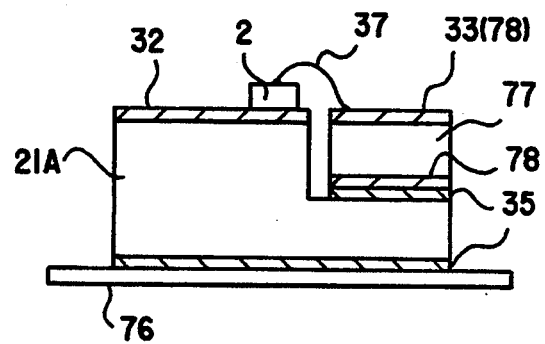

FIGS. 21(A) and 21(B) show a subcarrier member 21C corresponding to the subcarrier member 21A of FIG. 11. As will be seen from the side view of FIG. 21(B), the subcarrier member 21C is formed by simply attaching the metal sheet 76 upon the subcarrier 21A via the braze layer 35.

As can be seen in FIG. 21(A), it will be noted that the subcarrier 21C is held generally at the central part of the metal sheet 76.

The subcarrier member 21B or 21C can be mounted upon the case 22 of the laser diode assembly 20 by fixing the metal sheet 76 on the depression part $25_{-4}$ by means of the adhesive 35 or 38. In the construction of FIG. 19, it will be noted that one can reduce the amount of the adhesive as a result of the reduced gap 79. Thereby, the efficiency of dissipation of heat from the subcarrier member 21B or 21c to the case 22 is maximized by providing a path through the adhesive 38, in addition to the path in which the heat is dissipated directly from the carrier member 21B to the case 22. The efficiency of heat dissipation is further increased by employing a braze alloy having a large thermal conductivity in place of the adhesive 35 or 38.

The construction of FIG. 19 has another advantageous feature in that the entirety of the peripheral part of the metal sheet 76 is fixed upon the case 22. Thereby, a large area of the sheet 76 is attached to the case 22, in spite of the fact that the size of the subcarrier member 21 itself is small. Accordingly, the sheet 76 is adhered to the case 22 with reliability. Further, the efficiency of the heat dissipation through the sheet 76 is improved substantially.

In the structure of FIG. 19, it should be noted that the size of the gap 79, formed between the metal sheet 76 and the surface 25-4a and filled by the braze alloy or adhesive, is substantially small. Thereby, the heat dissipation through the material filling the gap 79 is substantially facilitated.

Figure 22:
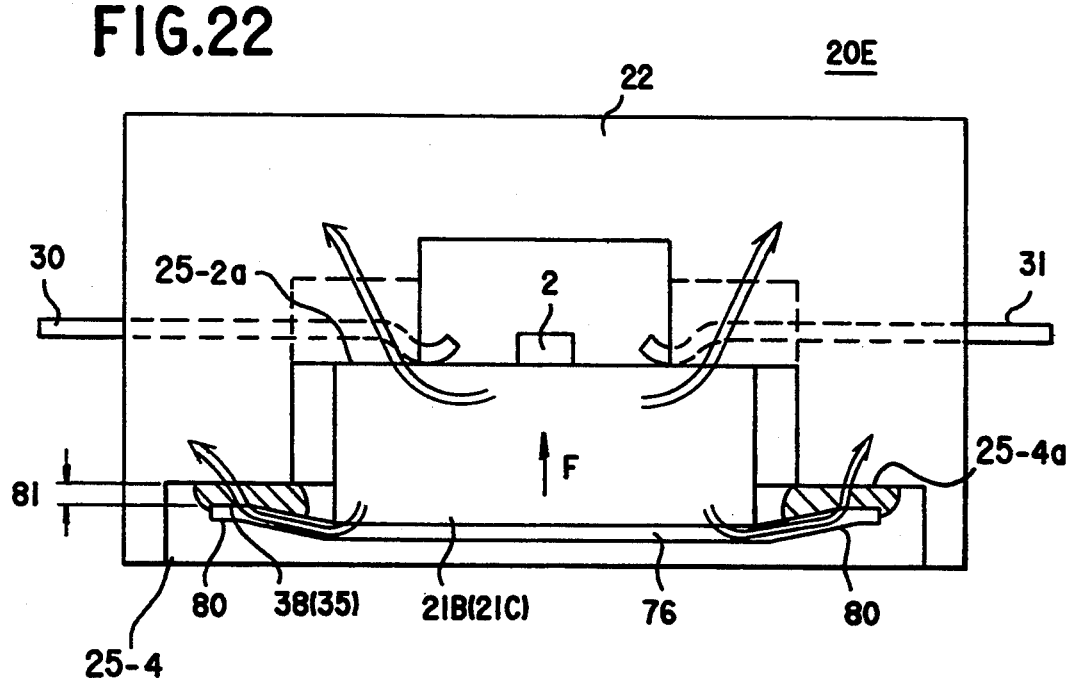
FIG. 22 is a diagram showing the construction of the laser diode assembly according to a sixth embodiment of the present invention.

FIG. 22 shows a laser diode assembly 20E according to a sixth embodiment of the present invention.

Referring FIG. 22, the laser diode assembly 20E includes the metal sheet 76 which is attached to the case 22 in an elastically deformed state. Thereby, there is formed a gap 81 of which size is smaller than the size of the foregoing gap 79.

Because of the force F exerted by the metal sheet 76 as a result of the elastic deformation, the subcarrier member 21 is urged in the upward direction in an abutting engagement with the reference surface 25-2a. Thereby, the abutting engagement is maintained even when the braze alloy or adhesive 38 causes a thermal dilatation.

Figure 23:
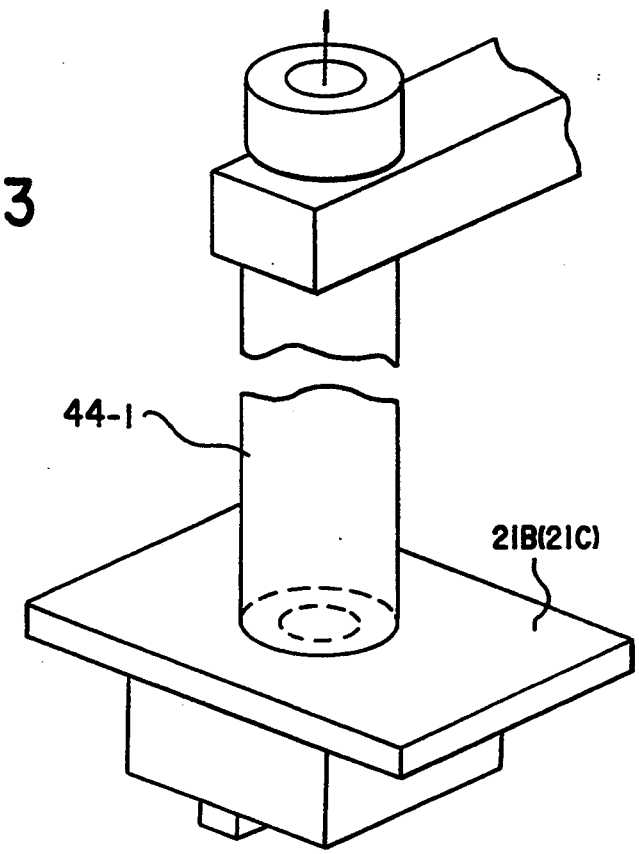
FIG. 23 is a diagram showing the suction apparatus used for the assembling of the apparatus of FIG. 22.

FIG. 23 shows a manipulation hand 44-1 hats is used in the assembling jig 40. The hand 44-1 holds the metal sheet 76 by applying a suction to the surface of the metal sheet at a side opposite to the side on which the subcarrier member is attached.

Figure 24:
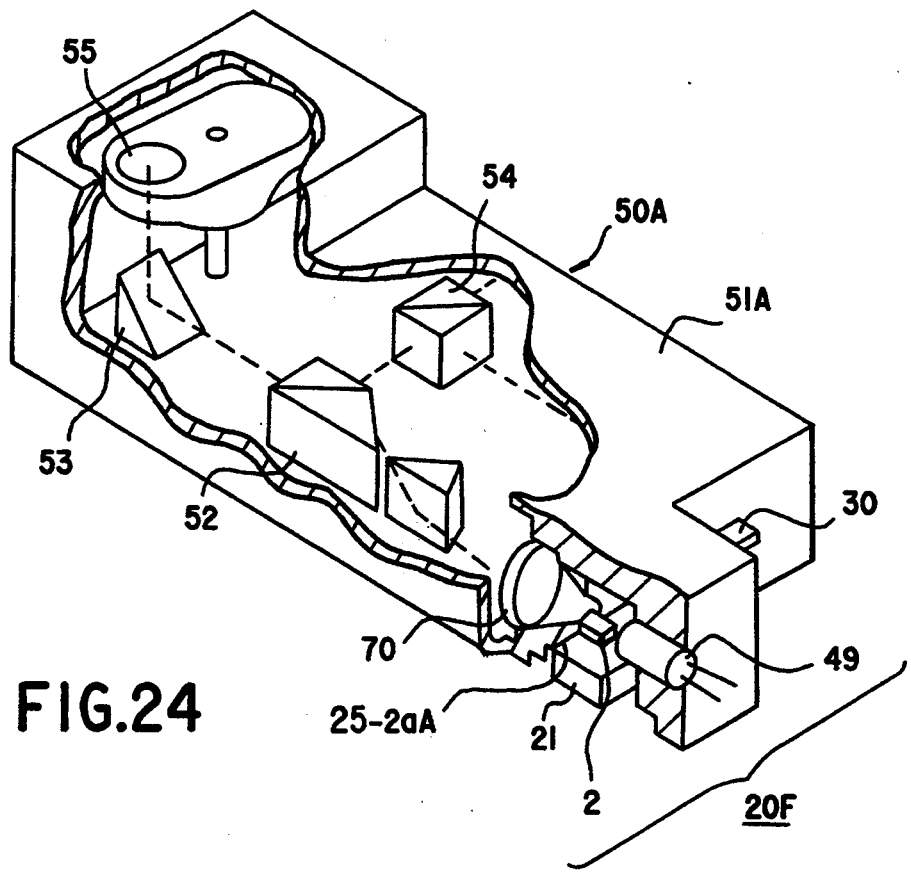
FIG. 24 is a diagram showing the construction of the laser diode assembly according to a seventh embodiment of the present invention.

FIG. 24 shows a laser diode assembly 20F according to a seventh embodiment of the present invention.

Referring to FIG. 24, the case 22 of the laser diode assembly 20F is used commonly by a host apparatus 50A that cooperates with the laser diode assembly 20F. In other words, the host apparatus 50A has a case 51A used also as the case 22 of the laser diode assembly 20F. The case 51A is formed with a surface 25-2aA, wherein the surface 25-2aA is used as the reference surface for positioning the subcarrier 21 of the laser diode 20F with respect to the host apparatus 50A.

Thereby, one may use the construction of FIG. 5 that uses adhesive for mounting the subcarrier 21 on the case 51A. Alternatively, one may use the metal sheet 76 for mounting the subcarrier 21 to the case 51A of the host apparatus 50A similarly to the embodiment explained already with reference to FIG. 22. As the modification of the present embodiment in view of the construction of FIG. 22 is obvious, further description will be omitted.

Further, the present invention is not limited to the embodiments described heretofore, but various variations and modifications may be made without departing from the scope of the invention.

What is claimed is:

1. An optical semiconductor apparatus adapted for mounting upon an external apparatus, said optical semiconductor apparatus comprising:
a laser diode for producing an optical beam;
a base body formed with a first reference surface adapted for engagement with said external apparatus when said optical semiconductor apparatus is mounted upon said external apparatus, and a second reference surface separated from said first reference surface with a predetermined distance; and
a subcarrier member having a principal surface for carrying said laser diode on said principal surface, said subcarrier being mounted upon said base body in an abutted state such that said principal surface establishes an intimate engagement with said second reference surface;
said base body being formed with a depression on said second reference surface so as to accommodate therein said laser diode when said subcarrier member is mounted upon said base body together with said laser diode that is mounted upon said principal surface.

2. An optical semiconductor apparatus as claimed in claim 1, wherein said base body has a rectangular shape having upper and lower principal surfaces, a second depression being formed on said lower principal surface, said second depression being defined by a bottom surface acting as said second reference surface, said second depression having a size sufficient for accommodating said subcarrier member therein, wherein one of said upper and lower major surfaces of said base body acting as said first reference surface.

3. An optical semiconductor apparatus as claimed in claim 1, wherein said base body includes a passage of said optical beam that is produced by said laser diode, said passage being closed by an optical element.

4. An optical semiconductor apparatus as claimed in claim 1, wherein said semiconductor optical apparatus further comprises an elastic electrode protruding into said depression in which said laser diode is accommodated, such that said elastic electrode engages with said principal surface of said subcarrier member resiliently.

5. An optical semiconductor apparatus as claimed in claim 1, wherein said subcarrier member includes a metal plate provided on a principal surface of said subcarrier member that opposes said principal surface on which said laser diode is provided, said metal plate being fixed upon said base body and having a size larger than a size of said subcarrier member.

6. An optical semiconductor apparatus as claimed in claim 5, wherein said metal plate is fixed upon said base body in a elastically deformed state when said subcarrier member is abutted to said first reference surface of said base body.

7. An electronic apparatus, comprising:
a body formed with a reference surface;
a subcarrier member having a principal surface and mounted upon said body such that said principal surface of said subcarrier establishes an intimate contact with said reference surface of said body; and
a laser diode carried on said principal surface and producing an optical beam;
said body being formed with a cavity at said reference surface for accommodating said laser diode.

8. An optical semiconductor apparatus as claimed in claim 7, wherein said subcarrier member includes a metal plate provided on a principal surface of said subcarrier member that opposes said principal surface on which said laser diode is provided, said metal plate having a size larger than a size of said subcarrier member and being fixed upon said body.

9. An optical semiconductor apparatus as claimed in claim 8, wherein said metal plate is fixed upon said base body in a elastically deformed state when said subcarrier member is abutted to said first reference surface of said body.

10. A method for manufacturing an optical semiconductor apparatus, said optical semiconductor apparatus comprising: a laser diode for producing an optical beam; a base body formed with a first reference surface adapted for engagement with said external apparatus when said optical semiconductor apparatus is mounted upon said external apparatus, and a second reference surface separated from said first reference surface with a predetermined distance; and a subcarrier member having a principal surface for carrying said laser diode on said principal surface, said subcarrier being mounted upon said base body in an abutted state such that said principal surface establishes an intimate engagement with said second reference surface; said base body being formed with a depression on said second reference surface so as to accommodate therein said laser diode when said subcarrier member is mounted upon said base body together with said laser diode that is mounted upon said principal surface; wherein said method comprises a step of:

moving said subcarrier member with respect to said base body in the state that said laser diode carried thereon is energized, while maintaining said intimate engagement between said subcarrier member and said base body.

* * * * *

UNITED STATES PATENT AND TRADEMARK OFFICE
CERTIFICATE OF CORRECTION

PATENT NO. : 5,404,368
DATED : April 4, 1995
INVENTOR(S) : Makita et al

It is certified that error appears in the above-indentified patent and that said Letters Patent is hereby corrected as shown below:

On the cover page, after Item [22], please add Item --
[30]  Foreign Application Priority Data
October 14, 1992 [JP] Japan .......... 4-276305 --.

Signed and Sealed this

Eighth Day of August, 1995

Attest:

BRUCE LEHMAN

*Attesting Officer*   *Commissioner of Patents and Trademarks*